(12) United States Patent
Tu

(10) Patent No.: US 11,258,033 B2
(45) Date of Patent: Feb. 22, 2022

(54) DISPLAY PANEL AND DISPLAY MODULE

(71) Applicant: WUHAN CHINA STAR OPTOELECTRONICS SEMICONDUCTOR DISPLAY TECHNOLOGY CO., LTD., Hubei (CN)

(72) Inventor: Xin Tu, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 287 days.

(21) Appl. No.: 16/498,188

(22) PCT Filed: Jun. 27, 2019

(86) PCT No.: PCT/CN2019/093223
§ 371 (c)(1),
(2) Date: Sep. 26, 2019

(87) PCT Pub. No.: WO2020/228105
PCT Pub. Date: Nov. 19, 2020

(65) Prior Publication Data
US 2021/0328173 A1    Oct. 21, 2021

(30) Foreign Application Priority Data

May 10, 2019    (CN) .......................... 201910387709.4

(51) Int. Cl.
*H01L 51/52*    (2006.01)
*H01L 27/32*    (2006.01)

(52) U.S. Cl.
CPC ...... *H01L 51/5215* (2013.01); *H01L 27/3246* (2013.01); *H01L 2251/308* (2013.01)

(58) Field of Classification Search
CPC ............. H01L 51/5215; H01L 27/3246; H01L 2251/308; H01L 51/52; H01L 27/32
(Continued)

(56) References Cited

U.S. PATENT DOCUMENTS

2007/0131914 A1    6/2007    Elschner et al.
2011/0198572 A1*   8/2011    Park .................... H01L 27/3258
                                                                        257/40
(Continued)

FOREIGN PATENT DOCUMENTS

CN    103444262 A    12/2013
CN    103503571 A    1/2014
(Continued)

*Primary Examiner* — Didarul A Mazumder

(57) ABSTRACT

A display panel and a display module, the display panel includes a substrate. The display panel includes a display area and a non-display area; a switch array layer disposed on the substrate, the switch array layer includes a first metal layer and a second metal layer; an anode layer disposed on the switch array layer, the anode layer includes a first sub-portion positioned within the display area and a second sub-portion positioned within the non-display area; viscosity of material of the second sub-portion is greater than viscosity of material of the first sub-portion. The display panel and the display module of the invention can avoid detach of the anode layer, thereby improving electrical conductivity of the anode layer.

19 Claims, 1 Drawing Sheet

(58) Field of Classification Search
USPC .................................... 257/40; 438/82, 99
See application file for complete search history.

(56) References Cited

U.S. PATENT DOCUMENTS

| | | |
|---|---|---|
| 2012/0025225 A1 | 2/2012 | Oda et al. |
| 2014/0008628 A1 | 1/2014 | Yamana et al. |
| 2014/0027753 A1 | 1/2014 | Yamana et al. |
| 2015/0034921 A1* | 2/2015 | Kim .................... H01L 27/3272 257/40 |
| 2016/0365398 A1* | 12/2016 | Kim .................... H01L 27/3258 |
| 2017/0317154 A1* | 11/2017 | Heo .................... H01L 27/3211 |
| 2018/0097034 A1* | 4/2018 | Lee .................... H01L 23/3142 |
| 2018/0342706 A1 | 11/2018 | Zhang |
| 2020/0052051 A1* | 2/2020 | Lee .................... H01L 27/3246 |

FOREIGN PATENT DOCUMENTS

| | | |
|---|---|---|
| CN | 105261634 A | 1/2016 |
| CN | 107230747 A | 10/2017 |
| WO | 2018218740 A1 | 12/2018 |

\* cited by examiner

DISPLAY PANEL AND DISPLAY MODULE

FIELD OF INVENTION

The present invention relates to the field of display technology, and in particular, to a display panel and a display module.

BACKGROUND OF INVENTION

In the present display field, flexible organic light-emitting diodes (OLEDs) display panels are favored by industry for their low power consumption, fast response times, and bendability. The demand for flexible organic light-emitting diode display panels is increasing, and their prospects in the future are optimistic.

At present, OLED panels are encapsulated with an inorganic layer to block water and oxygen, and anode layer is a whole layer structure which extends to non-display area. A material structure of the current anode layer is indium tin oxide/silver/indium tin oxide. The anode layer of the non-display area and the inorganic layer for encapsulation are in direct contact.

Technical Problem

An inorganic layer has poor ability to block water and oxygen, such that water and oxygen easily penetrate into anode layer through the inorganic layer, resulting in detach of transparent indium tin oxide (ITO) and silver, thereby reducing the electrical conductivity of the anode layer.

SUMMARY OF INVENTION

To solve the above technical problem, the present invention provides a display panel, including: a substrate, wherein the display panel includes a display area and a non-display area; a switch array layer disposed on the substrate; and an anode layer disposed on the switch array layer, wherein the anode layer includes a first sub-portion positioned within the display area and a second sub-portion positioned within the non-display area, and viscosity of material of the second sub-portion is greater than viscosity of material of the first sub-portion.

The invention further provides a display module including the above display panel.

Beneficial Effect

The display panel and the display module of the present invention divide the anode layer into a first sub-portion positioned within the display area and a second sub-portion positioned within the non-display area. Viscosity of material of the second sub-portion is greater than viscosity of material of the first sub-portion, thereby avoid detach of the anode layer, and improving the electrical conductivity of the anode layer.

DESCRIPTION OF DRAWINGS

In order to more clearly illustrate the technical solutions in the embodiments of the present invention, the following figures described in the embodiments will be briefly introduced. It is obvious that the drawings described below are merely some embodiments of the present invention, other drawings can also be obtained by the person ordinary skilled in the field based on these drawings without doing any creative activity.

DETAILED DESCRIPTION OF PREFERRED EMBODIMENTS

Figure 1:
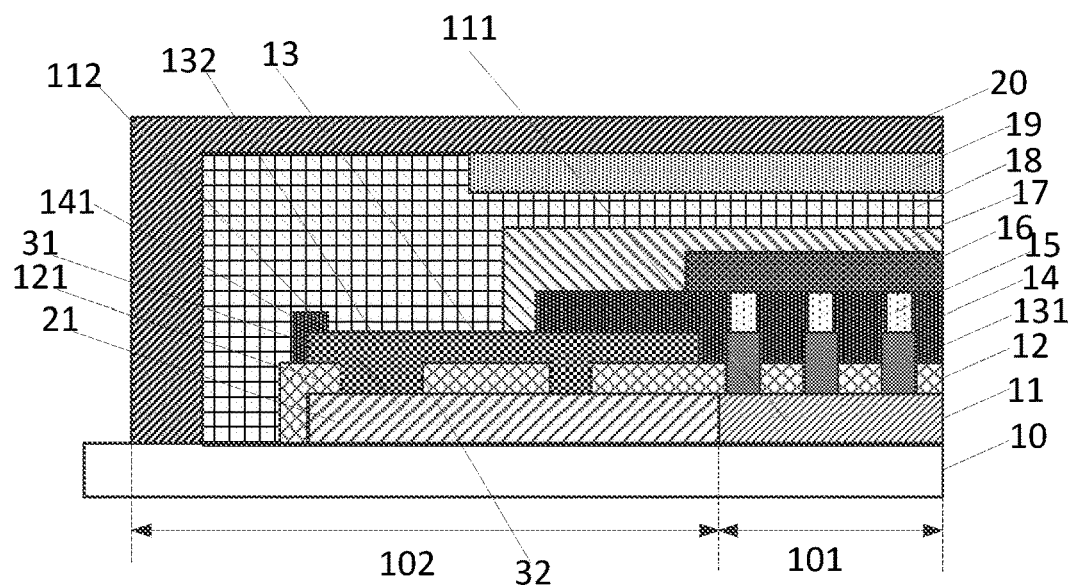
FIG. 1 is a schematic structural view of a display panel according to embodiment 1 of the present invention.

The following description of the embodiments is provided to illustrate the specific embodiments of the invention. Directional terminology mentioned in the application, such as "above", "under", "front", "back", "left", "right", "inside", "outside", "side", etc., are only refer to the directions of the accompanying drawings. Therefore, the directional terminology used is for illustrating and understanding the application and is not intended to limit the application. In the figures, structurally similar elements are denoted by the same reference numerals.

Please refer to FIG. 1. FIG. 1 is a schematic structural diagram of a display panel according to embodiment 1 of the present invention. As shown in FIG. 1, the display panel of the present invention includes a display area 101 and a non-display area 102 at a plan view angle. The display panel includes a substrate 10, a switch array layer (not shown), and an anode layer 13. The display panel of the present invention is an organic light-emitting diode (OLED) display panel. The material of the substrate 10 may be polyimide (PI).

The switch array layer includes a plurality of thin-film transistors, and the switch array layer is disposed on the substrate 10. The switch array layer includes a first metal layer (not shown) and a second metal layer 11, wherein the first metal layer positioned within the display area includes a gate. The second metal layer 11 positioned within the display region 101 includes a source and a drain 111, and the second metal layer 11 positioned within the non-display region 102 includes a signal wire 112.

The anode layer 13 is disposed on the switch array layer, the anode layer 13 includes a first sub-portion 131 positioned within the display area 101 and a second sub-portion 132 positioned within the non-display area 102. Viscosity of material of the second sub-portion 132 is greater than viscosity of material of the first sub-portion 131.

In one embodiment, the material of the second sub-portion 132 is the same as the material of the second metal layer 11, and the material of the second sub-portion 132 is different from the material of the first sub-portion 131 to further improve the electrical conductivity of the display panel.

Material structure of the second metal layer 11 and material structure of the second sub-portion 132 are a stacked structure of titanium, aluminum, and titanium. Material structure of the first sub-portion 131 is a stacked structure of indium tin oxide, silver, and indium tin oxide.

An outer end 21 of the second metal layer 11 is covered with the first blocking portion 121, and the outer end 21 of the second metal layer 11 is covered with a first blocking portion 121, the outer end 21 of the second metal layer 11 is an end of the second metal layer that is adjacent to a side of the non-display area 102. Because the first blocking portion is provided, water and oxygen can be further prevented from entering the signal wire layer to protect the signal wire, thereby improving electrical conductivity of the display panel.

In one embodiment, in order to simplify process, a planarization layer 12 is disposed between the second metal layer 11 and the anode layer 13. The planarization layer is disposed between the second metal layer and the anode layer, the first blocking portion 121 and the planarization layer 12 are formed in the same process. That is, the first blocking portion 121 is formed in the process of preparing the planarization layer 12, and the planarization layer 12 covers the outer end 21 of the second metal layer.

The planarization layer 12 positioned within the non-display area 102 is provided with a first via-hole 32; the second sub-portion 132 is electrically connected to the signal wire 112 through the first via-hole 32. The planarization layer 12 positioned within the display area 101 is further provided with a second via-hole (not shown). The first sub-portion 131 is electrically connected to the drain through the second via-hole.

An outer end 31 of the second sub-portion 132 is covered with a second blocking portion 41, the outer end 31 of the second sub-portion is an end of the second sub-portion 131 that is adjacent to a side of the non-display area 102. Because the second blocking portion 41 is provided, water and oxygen can be further prevented from entering the second sub-portion to protect the second sub-portion, further improving the electrical conductivity of the display panel.

In one embodiment, in order to simplify the process, the display panel further includes a pixel defining layer 14 disposed on the anode layer 13. The second blocking portion 141 is formed in the same process as the pixel defining layer 14. That is, the second blocking portion 141 is formed in the process of forming the pixel defining layer 14, and the pixel defining layer 14 covers the outer end of the second sub-portion 132.

The display panel may further include an organic light-emitting layer 15, an evaporation functional layer 16, a cathode 17, a first inorganic layer 18, a first organic layer 19, and a second inorganic layer 20. The inorganic layer can be prepared by methods such as plasma enhanced chemical vapor deposition (PECVD), atomic layer deposition (ALD), and physical vapor deposition (PVD). The material of the inorganic layer is not limited to $SiN_x$, $SiO_xN_y$, $SiO_x$, $SiC_xN_y$, ZnO, $AlO_x$, etc. An outer boundary of the inorganic layer covers the first blocking portion and the second blocking portion. The first organic layer 19 is deposited on the first inorganic layer 18 by a process such as ink-jet printing (IJP) and dispensing, or the like. The material of the first organic layer 19 is not limited to acrylate, epoxy resin, polyimide, silicone, or the like. An outer boundary of the first organic layer 19 cannot exceed the first blocking portion.

The anode layer is divided into a first sub-portion positioned within the display area and a second sub-portion positioned within the non-display area, and viscosity of material of the second sub-portion is greater than that of material of the first sub-portion. Even if water and oxygen intrude into the anode layer through the inorganic layer, because the viscosity between the layers of the second sub-portion is greater (specifically, an interfacial adhesion between titanium/aluminum/titanium structure is much greater than that of indium tin oxide/silver/indium tin oxide structure), such that detach of the anode layer is avoided, and the electrical conductivity of the anode layer is improved.

Figure 2:
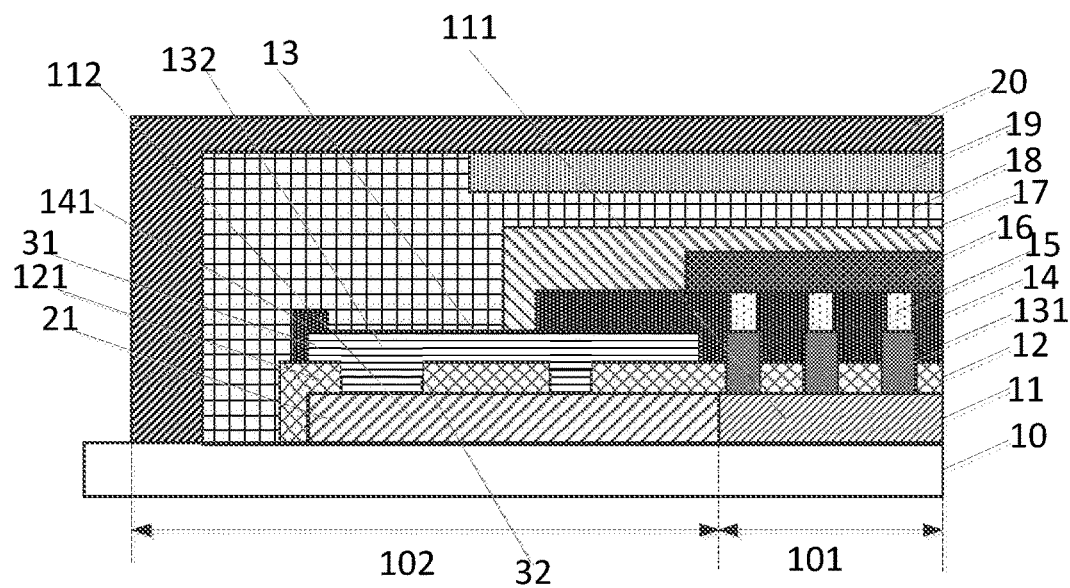
FIG. 2 is a schematic structural diagram of a display panel according to embodiment 2 of the present invention.

Please refer to FIG. 2. FIG. 2 is a schematic structural diagram of a display panel according to embodiment 2 of the present invention. As shown in FIG. 2, the difference between the embodiment 2 and the embodiment 1 is that the material of the second sub-portion 132 is the same as the material of the first metal layer and the material of the second sub-portion 132 is different from the material of the first sub-portion 131 to further improve the electrical conductivity of the display panel.

Material of the first metal layer and material of the second sub-portion 132 are both molybdenum (Mo), and material structure of the first sub-portion 131 is a stacked structure of indium tin oxide (ITO), silver (Ag), and indium tin oxide (ITO).

Viscosity of the material of the second sub-portion of the single-layer structure is greater than viscosity of the material of the first sub-portion of the multilayer structure. Even if water and oxygen penetrate into the anode layer through the inorganic layer, because the viscosity between the layers of the second sub-portion is greater, detach of the anode layer is avoided, and the electrical conductivity of the anode layer is improved.

The present invention further provides a display module comprising any one of the above display panels, and further comprising a touch screen. The invention further provides an electronic device comprising any one of the above display modules.

The display panel and the display module of the present invention divide the anode layer into a first sub-portion positioned within the display area and a second sub-portion positioned within the non-display area. Viscosity of material of the second sub-portion is greater than viscosity of material of the first sub-portion, thereby avoid detach of the anode layer, and improving the electrical conductivity of the anode layer.

In the description of the present specification, reference is made to the descriptions of the terms "one embodiment", "some embodiments", "illustrative embodiments", "example", "specific example", or "some examples", etc. mean that the specific features, structures, materials, or characteristics described in the embodiments or examples are included in at least one embodiment or example of the invention. In the present specification, the schematic representation of the above terms does not necessarily mean the same embodiment or example. Moreover, the particular features, structures, materials, or characteristics described may be combined in a suitable manner in one or more embodiments or examples.

The description of the above exemplary embodiments is only for the purpose of understanding the invention. It is to be understood that the present invention is not limited to the disclosed exemplary embodiments. It is obvious to those skilled in the art that the above exemplary embodiments may be modified without departing from the scope and spirit of the present invention.

What is claimed is:

1. A display panel, comprising:
   a substrate, wherein the display panel comprises a display area and a non-display area;
   a switch array layer disposed on the substrate; and
   an anode layer disposed on the switch array layer, wherein the anode layer comprises a first sub-portion positioned within the display area and a second sub-portion positioned within the non-display area, and viscosity of material of the second sub-portion is greater than viscosity of material of the first sub-portion;
   wherein the switch array layer comprises a first metal layer, material of the second sub-portion is same as material of the first metal layer, and material of the second sub-portion is different from material of the first sub-portion; and
   wherein the materials of the first metal layer and the second sub-portion are molybdenum, and a material structure of the first sub-portion is a stacked structure of indium tin oxide, silver, and indium tin oxide.

2. A display panel, comprising:
a substrate, wherein the display panel comprises a display area and a non-display area;
a switch array layer disposed on the substrate; and
an anode layer disposed on the switch array layer, wherein the anode layer comprises a first sub-portion positioned within the display area and a second sub-portion positioned within the non-display area, and viscosity of material of the second sub-portion is greater than viscosity of material of the first sub-portion.

3. The display panel according to claim 2, wherein the switch array layer comprises a first metal layer; the material of the second sub-portion is the same as the material of the first metal layer, and the material of the second sub-portion is different from the material of the first sub-portion.

4. The display panel according to claim 3, wherein the material of the first metal layer and the material of the second sub-portion are both molybdenum, and a material structure of the first sub-portion is a stacked structure of indium tin oxides, silver, and indium tin oxides.

5. The display panel according to claim 2, wherein the switch array layer comprises a second metal layer, and the material of the second sub-portion is the same as material of the second metal layer, and the material of the second sub-portion is different from the material of the first sub-portion.

6. The display panel according to claim 5, wherein a material structure of the second metal layer and a material structure of the second sub-portion are stacked structures of titanium, aluminum, and titanium, and a material structure of the first sub-portion is a stacked structure of indium tin oxide, silver, and indium tin oxide.

7. The display panel according to claim 2, wherein the switch array layer comprises a second metal layer, the second metal layer positioned in the display area comprises a source and a drain, and an outer end of the second metal layer is covered with a first blocking portion, the outer end of the second metal layer is an end of the second metal layer that is adjacent to a side of the non-display area.

8. The display panel according to claim 7, further comprising a planarization layer disposed between the second metal layer and the anode layer, and the first blocking portion and the planarization layer are formed in the same process.

9. The display panel according to claim 2, wherein an outer end of the second sub-portion is covered with a second blocking portion, the outer end of the second sub-portion is an end of the second sub-portion that is adjacent to a side of the non-display area.

10. The display panel according to claim 9, further comprising a pixel defining layer disposed on the anode layer, and the second blocking portion is formed in the same process as the pixel defining layer.

11. A display module, comprising the display panel of claim 2.

12. The display module according to claim 11, wherein the switch array layer comprises a first metal layer; material of the second sub-portion is the same as the material of the first metal layer, and the material of the second sub-portion is different from a material of the first sub-portion.

13. The display module according to claim 12, wherein the material of the first metal layer and the material of the second sub-portion are both molybdenum, and a material structure of the first sub-portion is a stacked structure of indium tin oxides, silver, and indium tin oxides.

14. The display module according to claim 11, wherein the switch array layer comprises a second metal layer; and the material of the second sub-portion is the same as a material of the second metal layer, and the material of the second sub-portion is different from the material of the first sub-portion.

15. The display module according to claim 14, wherein a material structure of the second metal layer and a material structure of the second sub-portion are stacked structures of titanium, aluminum, and titanium, and a material structure of the first sub-portion is a stacked structure of indium tin oxide, silver, and indium tin oxide.

16. The display module according to claim 11, wherein the switch array layer comprises a second metal layer, the second metal layer positioned in the display area comprises a source and a drain, and an outer end of the second metal layer is covered with a first blocking portion, the outer end of the second metal layer is an end of the second metal layer that is adjacent to a side of the non-display area.

17. The display module according to claim 16, further comprising a planarization layer disposed between the second metal layer and the anode layer, and the first blocking portion and the planarization layer are formed in the same process.

18. The display module according to claim 11, wherein an outer end of the second sub-portion is covered with a second blocking portion, the outer end of the second sub-portion is an end of the second sub-portion that is adjacent to a side of the non-display area.

19. The display module according to claim 18, further comprising a pixel defining layer disposed on the anode layer, and the second blocking portion is formed in the same process as the pixel defining layer.

* * * * *